(12) United States Patent
Chen et al.

(10) Patent No.: US 10,269,575 B2
(45) Date of Patent: Apr. 23, 2019

(54) SEMICONDUCTOR DEVICE WITH NON-LINEAR SURFACE

(71) Applicant: Taiwan Semiconductor Manufacturing Company Limited, Hsin-Chu (TW)

(72) Inventors: Xiaomeng Chen, Baoshan Township (TW); Chien-Hong Chen, Baoshan Township (TW); Shih-Chang Liu, Alian Township (TW); Zhiqiang Wu, Chubei (TW)

(73) Assignee: Taiwan Semiconductor Manufacturing Company Limited, Hsin-chu (TW)

( * ) Notice: Subject to any disclaimer, the term of this patent is extended or adjusted under 35 U.S.C. 154(b) by 0 days.

(21) Appl. No.: 15/072,598

(22) Filed: Mar. 17, 2016

(65) Prior Publication Data

US 2016/0196983 A1 Jul. 7, 2016

Related U.S. Application Data

(62) Division of application No. 14/046,987, filed on Oct. 6, 2013, now Pat. No. 9,299,768.

(51) Int. Cl.
*H01L 29/66* (2006.01)
*H01L 21/306* (2006.01)
(Continued)

(52) U.S. Cl.
CPC .... *H01L 21/30604* (2013.01); *H01L 21/3083* (2013.01); *H01L 29/045* (2013.01);
(Continued)

(58) Field of Classification Search
CPC ............. H01L 21/30604; H01L 29/161; H01L 21/3083; H01L 29/66795; H01L 29/7853; H01L 29/045; H01L 29/66537; H01L 21/76224; H01L 29/0673; H01L 29/66818; H01L 29/42384; H01L 29/742;
(Continued)

(56) References Cited

U.S. PATENT DOCUMENTS

2002/0074552 A1\* 6/2002 Weeks, Jr. ............. C30B 23/02
257/76
2009/0090934 A1\* 4/2009 Tezuka ................ H01L 27/1211
257/190
(Continued)

OTHER PUBLICATIONS

Sorab K Ghandhi, VLSI Fabrication Principles: Silicon and Gallium Arsenide, Apr. 1994, pp. 589, 620.\*
(Continued)

*Primary Examiner* — Marcos D Pizarro Crespo
*Assistant Examiner* — Nelson Garces
(74) *Attorney, Agent, or Firm* — Cooper Legal Group, LLC

(57) ABSTRACT

A semiconductor device includes a channel having a first linear surface and a first non-linear surface. The first non-linear surface defines a first external angle of about 80 degrees to about 100 degrees and a second external angle of about 80 degrees to about 100 degrees. The semiconductor device includes a dielectric region covering the channel between a source region and a drain region. The semiconductor device includes a gate electrode covering the dielectric region between the source region and the drain region.

20 Claims, 14 Drawing Sheets

(51) Int. Cl.
    *H01L 29/78*    (2006.01)
    *H01L 29/94*    (2006.01)
    *H01L 21/8246*  (2006.01)
    *H01L 21/00*    (2006.01)
    *H01L 21/8234*  (2006.01)
    *H01L 21/8242*  (2006.01)
    *H01L 21/20*    (2006.01)
    *H01L 29/04*    (2006.01)
    *H01L 21/308*   (2006.01)
    *H01L 29/161*   (2006.01)
    *H01L 21/762*   (2006.01)
    *H01L 29/06*    (2006.01)

(52) U.S. Cl.
    CPC ...... *H01L 29/161* (2013.01); *H01L 29/66795* (2013.01); *H01L 29/7853* (2013.01); *H01L 21/76224* (2013.01); *H01L 29/0673* (2013.01); *H01L 29/66537* (2013.01)

(58) Field of Classification Search
    CPC ......... H01L 29/78687; H01L 29/78696; H01L 29/66545; H01L 29/165; H01L 29/785; H01L 2924/0002; H01L 29/78648; H01L 29/42376; H01L 29/78645; H01L 29/0634; H01L 25/0657
    USPC .................................. 257/178–188, 250–260
    See application file for complete search history.

(56)            References Cited

U.S. PATENT DOCUMENTS

| 2010/0059807 | A1* | 3/2010 | Cho ................. H01L 27/10814 257/306 |
| 2010/0059822 | A1* | 3/2010 | Pinguet .................. H01L 21/84 257/351 |
| 2011/0115023 | A1* | 5/2011 | Cheng .................. H01L 21/845 257/350 |
| 2011/0220964 | A1  | 9/2011 | Shin et al. |
| 2013/0200450 | A1* | 8/2013 | Kusai ................ H01L 29/66833 257/324 |

OTHER PUBLICATIONS

Corresponding Chinese application No. 201310689575.4, Chinese Office action dated Dec. 8, 2016.

* cited by examiner

SEMICONDUCTOR DEVICE WITH NON-LINEAR SURFACE

RELATED APPLICATION

This application is a divisional of and claims priority to U.S. patent application Ser. No. 14/046,987, titled "SEMICONDUCTOR DEVICE WITH NON-LINEAR SURFACE" and filed on Oct. 6, 2013, which is incorporated herein by reference.

BACKGROUND

A fin-type field effect transistor is a type of semiconductor device in which current flows between a source region and a drain region of the device, through a channel of the device, upon application of a voltage or bias to a gate of the device. When current flows through the channel, the device is generally regarded as being in an 'on' state, and when current is not flowing through the channel, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
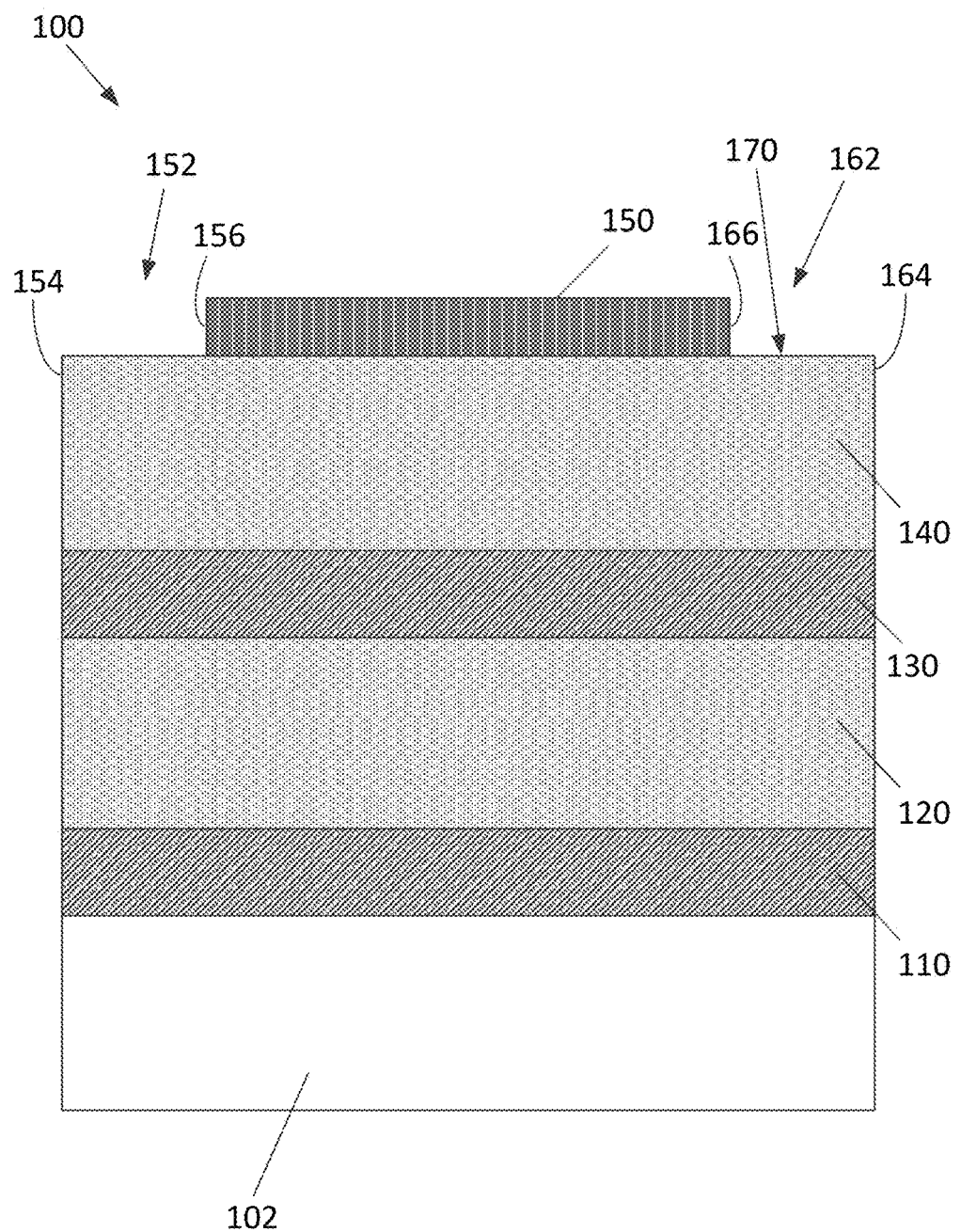
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a sectional view illustrating a semiconductor device 100 according to some embodiments. In an embodiment, the semiconductor device 100 is formed upon a substrate 102. The substrate 102 comprises any number of materials, such as, for example, silicon, germanium, etc., alone or in combination. According to some embodiments, the substrate 102 comprises an epitaxial layer, a silicon-on-insulator (SOI) structure, etc. According to some embodiments, the substrate 102 corresponds to a wafer or a die formed from a wafer.

According to some embodiments, the semiconductor device 100 comprises one or more layers. In some embodiments, the semiconductor device 100 includes a first layer 110. In an embodiment, the first layer 110 is formed upon the substrate 102. The first layer 110 comprises any number of materials, such as, for example, silicon germanium, etc. According to some embodiments, the first layer 110 is formed by deposition, epitaxial growth, etc. In an embodiment, the first layer 110 functions as a barrier layer, stopping layer or etch stop layer (ESL).

According to some embodiments, the semiconductor device 100 comprises one or more substrate layers. In some embodiments, the semiconductor device 100 includes a first substrate layer 120. In an embodiment, the first substrate layer 120 is formed upon the first layer 110. The first substrate layer 120 comprises any number of materials, such as, for example, silicon, germanium, etc., alone or in combination. According to some embodiments, the first substrate layer 120 comprises the same material as the substrate 102. In some embodiments, the first substrate layer 120 is formed by deposition, epitaxial growth, etc.

According to some embodiments, the semiconductor device 100 includes a second layer 130. In an embodiment, the second layer 130 is formed upon the first substrate layer 120. The second layer 130 comprises any number of materials, such as, for example, silicon germanium, etc. According to some embodiments, the second layer 130 comprises the same material as the first layer 110. In some embodiments, the second layer 130 is formed by deposition, epitaxial growth, etc. In an embodiment, the second layer 130 functions as a barrier layer, stopping layer or etch stop layer (ESL).

According to some embodiments, the semiconductor device 100 includes a second substrate layer 140. In an embodiment, the second substrate layer 140 is formed upon the second layer 130. The second substrate layer 140 comprises any number of materials, such as, for example, silicon, germanium, etc., alone or in combination. According to some embodiments, the second substrate layer 140 comprises the same material as the substrate 102. According to some embodiments, the second substrate layer 140 comprises the same material as the first substrate layer 120. In some embodiments, the second substrate layer 140 is formed by deposition, epitaxial growth, etc.

According to some embodiments, a mask layer 150 is formed over the second substrate layer 140. The mask layer 150 includes any number of materials, including silicon oxide, silicon nitride, nitride, etc., alone or in combination. In some embodiments, the mask layer 150 extends across the entire second substrate layer 140.

In some embodiments, one or more openings are formed in the mask layer 150. In an embodiment, a first mask opening 152 is formed in the mask layer 150, such as by etching, for example. In an embodiment, the first mask opening 152 is formed between a first device end 154 and a first mask end 156. In some embodiments, a second mask opening 162 is formed in the mask layer 150, such as by etching, for example. In an embodiment, the second mask opening 162 is formed between a second device end 164 and a second mask end 166. In some embodiments, the first mask opening 152 and second mask opening 162 are formed to an upper edge or top surface 170 of the second substrate layer 140.

Figure 2:
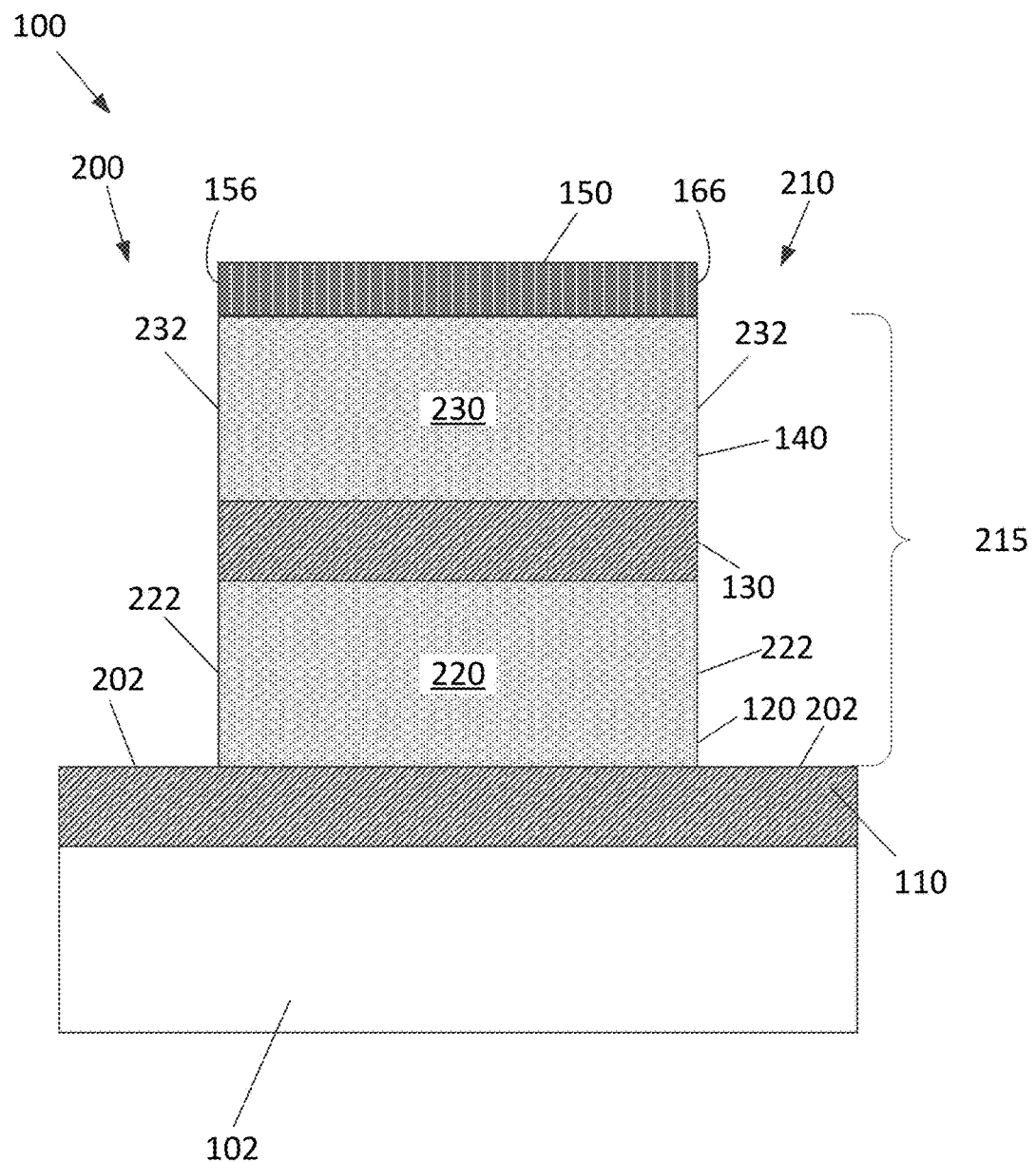
FIG. 2 illustrates a portion of a semiconductor device, according to an embodiment.

Turning to FIG. 2, in an embodiment, a portion of the semiconductor device 100 is removed, such as by dry or wet etching, for example, to form one or more openings. In an embodiment, a first opening 200 is formed by removing a portion of the first substrate layer 120, second layer 130, and second substrate layer 140 below the first mask opening 152 (illustrated in FIG. 1). In some embodiments, the first opening 200 is formed to an upper edge or top surface 202 of the first layer 110. In an embodiment, the etch chemistry for etching through the first substrate layer 120 and the second substrate layer 140 includes chlorine, hydrogen bromide, etc., alone or in combination. In an embodiment, the etch chemistry for etching through the second layer 130 includes boron trichloride, argon, etc., alone or in combination.

In an embodiment, a second opening 210 is formed by removing a portion of the first substrate layer 120, second layer 130, and second substrate layer 140 below the second mask opening 162 (illustrated in FIG. 1). In some embodiments, the second opening 210 is formed to the upper edge or top surface 202 of the first layer 110. In an embodiment, the etch chemistry for etching through the first substrate layer 120 and the second substrate layer 140 includes chlorine, hydrogen bromide, etc., alone or in combination. In an embodiment, the etch chemistry for etching through the second layer 130 includes boron trichloride, argon, etc., alone or in combination.

In some embodiments, a channel 215 is formed between the first opening 200 and the second opening 210. In an embodiment, the channel 215 comprises a first channel portion 220, the second layer 130, and a second channel portion 230. According to some embodiments, the channel 215 is not limited to the first channel portion 220 and second channel portion 230, and, instead, includes a plurality of channel portions (e.g., one or more channel portions). In an embodiment, the first channel portion 220 is disposed below the second layer 130 and above the first layer 110. In some embodiments, after the formation of the first opening 200 and the second opening 210, the first channel portion 220 includes first channel walls 222 that are substantially linear. In some embodiments, the second channel portion 230 is formed adjacent the first channel portion 220 between the first opening 200 and the second opening 210. In an embodiment, the second channel portion 230 is disposed below the mask layer 150 and above the second layer 130. In some embodiments, after the formation of the first opening 200 and the second opening 210, the second channel portion 230 includes second channel walls 232 that are substantially linear.

Figure 3:
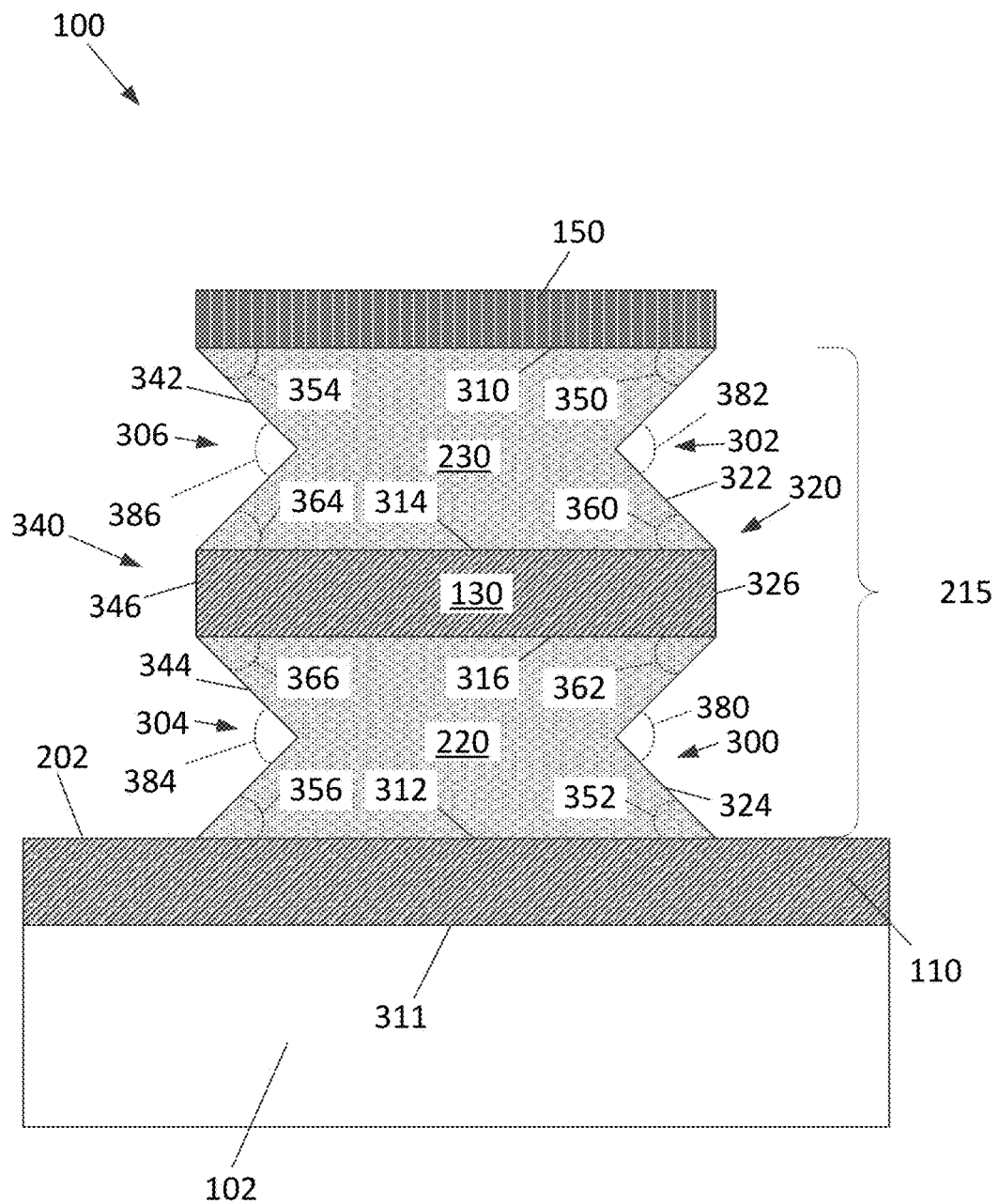
FIG. 3 illustrates forming a channel associated with forming a semiconductor device, according to an embodiment.

Turning to FIG. 3, in an embodiment, the channel 215 is patterned. In an embodiment, the first channel portion 220 of the channel 215 is patterned to form a first channel opening 300 and a third channel opening 304. In an embodiment, the second channel portion 230 of the channel 215 is patterned to form a second channel opening 302 and a fourth channel opening 306. In some embodiments, the channel openings 300, 302, 304, 306 are formed in the first channel portion 220 and second channel portion 230 by wet etching. In some embodiments, the wet etch chemistry includes tetramethylammonium hydroxide (TMAH), tetraethylammonium hydroxide (TEAH), ammonium hydroxide ($NH_4OH$), etc., alone or in combination. According to some embodiments, the wet etch chemistry selectively etches the first channel walls 222 and second channel walls 232 (illustrated in FIG. 2), while substantially not etching the first layer 110 or the second layer 130. In an embodiment, this etching forms the first channel opening 300 and third channel opening 304 in the first channel portion 220 of the channel 215 and the second channel opening 302 and the fourth channel opening 306 in the second channel portion 230 of the channel 215.

According to some embodiments, the channel 215 comprises a first linear surface 310. In an embodiment, the first linear surface 310 comprises a surface of the second channel portion 230. In an embodiment, the first linear surface 310 extends substantially parallel to the top surface 202 of the first layer 110. In some embodiments, the first linear surface 310 faces away from a top surface 311 of the substrate 102. In some embodiments, the first linear surface 310 is formed adjacent to and under the mask layer 150.

According to some embodiments, the channel 215 comprises a second linear surface 312. In some embodiments, the first linear surface 310 is substantially diametrically opposed to the second linear surface 312. In an embodiment, the second linear surface 312 comprises a surface of the first channel portion 220. In an embodiment, the second linear surface 312 extends substantially parallel to the top surface 202 of the first layer 110 and to the first linear surface 310. In some embodiments, the second linear surface 312 is formed adjacent to and above the first layer 110. According to some embodiments, the second linear surface 312 faces towards the top surface 311 of the substrate 102.

In some embodiments, the channel 215 comprises a third linear surface 314. In an embodiment, the third linear surface 314 extends substantially parallel to the second layer 130. In some embodiments, the third linear surface 314 is formed adjacent to and above the second layer 130. In some embodiments, the third linear surface 314 comprises a surface of the second channel portion 230. In some embodiments, the third linear surface 314 is substantially diametrically opposed to the first linear surface 310.

In some embodiments, the channel 215 comprises a fourth linear surface 316. In an embodiment, the fourth linear surface 316 extends substantially parallel to the second layer 130. In some embodiments, the fourth linear surface 316 is formed adjacent to and below the second layer 130. In some embodiments, the fourth linear surface 316 comprises a surface of the first channel portion 220. In some embodiments, the fourth linear surface 316 is substantially diametrically opposed to the second linear surface 312.

In some embodiments, the channel 215 comprises a first non-linear surface 320. In an embodiment, the first non-linear surface 320 comprises surfaces of the first channel portion 220, second layer 130, and second channel portion 230.

According to some embodiments, the first non-linear surface 320 comprises a first surface portion 322. In an embodiment, the first surface portion 322 comprises a surface of the second channel portion 230. In some embodiments, the first surface portion 322 extends between the first linear surface 310 and the third linear surface 314. In an embodiment, the first surface portion 322 includes the second channel opening 302. In some embodiments, the first non-linear surface 320 comprises a second surface portion 324. In an embodiment, the second surface portion 324 comprises a surface of the first channel portion 220. In some embodiments, the second surface portion 324 extends between the second linear surface 312 and the fourth linear surface 316. In an embodiment, the second surface portion 324 includes the first channel opening 300. In an embodiment, the first non-linear surface 320 comprises a third surface portion 326. In an embodiment, the third surface portion 326 comprises a surface of the second layer 130. In some embodiments, the third surface portion 326 extends between the first surface portion 322 and the second surface portion 324.

In some embodiments, the channel 215 comprises a second non-linear surface 340. In an embodiment, the second non-linear surface 340 comprises surfaces of the first channel portion 220, second layer 130, and second channel portion 230. In some embodiments, the first non-linear surface 320 is substantially diametrically opposed to the second non-linear surface 340 of the channel 215.

According to some embodiments, the second non-linear surface 340 comprises a fourth surface portion 342. In an embodiment, the fourth surface portion 342 comprises a surface of the second channel portion 230. In some embodiments, the fourth surface portion 342 extends between the first linear surface 310 and the third linear surface 314. In an embodiment, the fourth surface portion 342 includes the fourth channel opening 306. In some embodiments, the second non-linear surface 340 comprises a fifth surface portion 344. In an embodiment, the fifth surface portion 344 comprises a surface of the first channel portion 220. In some embodiments, the fifth surface portion 344 extends between the second linear surface 312 and the fourth linear surface 316. In an embodiment, the fifth surface portion 344 includes the third channel opening 304. In an embodiment, the first non-linear surface 320 comprises a sixth surface portion 346. In an embodiment, the sixth surface portion 346 comprises a surface of the second layer 130. In some embodiments, the sixth surface portion 346 extends between the fourth surface portion 342 and the fifth surface portion 344.

According to some embodiments, the first non-linear surface 320 defines a first angle 350 relative to the first linear surface 310. In some embodiments, the first angle is about 40 degrees to about 50 degrees. According to some embodiments, the first non-linear surface 320 defines a second angle 352 relative to the second linear surface 312 of the channel 215. In some embodiments, the second angle 352 is about 40 degrees to about 50 degrees. According to some embodiments, the second non-linear surface 340 defines a third angle 354 relative to the first linear surface 310. In some embodiments, the third angle 354 is about 40 degrees to about 50 degrees. According to some embodiments, the second non-linear surface 340 defines a fourth angle 356 relative to the second linear surface 312. In some embodiments, the fourth angle 356 is about 40 degrees to about 50 degrees.

According to some embodiments, the first surface portion 322 of the first non-linear surface 320 defines a fifth angle 360 relative to the third linear surface 314. In some embodiments, the fifth angle 360 is about 40 degrees to about 50 degrees. According to some embodiments, the second surface portion 324 of the first non-linear surface 320 defines a sixth angle 362 relative to the fourth linear surface 316. In some embodiments, the sixth angle 362 is about 40 degrees to about 50 degrees. According to some embodiments, the fourth surface portion 342 of the second non-linear surface 340 defines a seventh angle 364 relative to the third linear surface 314. In some embodiments, the seventh angle 364 is about 40 degrees to about 50 degrees. According to some embodiments, the fifth surface portion 344 of the second non-linear surface 340 defines an eighth angle 366 relative to the fourth linear surface 316. In some embodiments, the eighth angle 366 is about 40 degrees to about 50 degrees.

According to some embodiments, the first non-linear surface 320 defines a first external angle 380 of about 80 degrees to about 100 degrees. In some embodiments, the first external angle 380 is defined within the first channel opening 300 of the first channel portion 220. According to some embodiments, the first non-linear surface 320 defines a second external angle 382 of about 80 degrees to about 100 degrees. In some embodiments, the second external angle 382 is defined within the second channel opening 302 of the second channel portion 230. According to some embodiments, the second non-linear surface 340 defines a third external angle 384 of about 80 degrees to about 100 degrees. In some embodiments, the third external angle 384 is defined within the third channel opening 304 of the first channel portion 220. According to some embodiments, the second non-linear surface 340 defines a fourth external angle 386 of about 80 degrees to about 100 degrees. In some embodiments, the fourth external angle 386 is defined within the fourth channel opening 306 of the second channel portion 230.

According to some embodiments, although the FIGS. illustrate sharp or pointed edges, corners, etc., such as defining angles 350, 352, 354, 356, 360, 362, 364, 366, 380, 382, 384, 386, etc., that such edges, corners, etc. may be somewhat rounded, blunted, beveled, etc. when the semiconductor device 100 is fabricated. According to some embodiments, at least some of the angles described herein nevertheless persist to the angular ranges described herein when the semiconductor device 100 is fabricated.

In some embodiments, the first non-linear surface 320 comprises a {111} surface crystal orientation. In some embodiments, the second non-linear surface 340 comprises a {111} surface crystal orientation. According to some embodiments, the {111} surface crystal orientation provides improved mobility through the channel 215. As such, in some embodiments, the {111} surface crystal orientation provides improved performance of the semiconductor device 100. According to some embodiments, at least some of the surfaces described herein as comprising a {111} surface crystal orientation comprise a surface crystal orientation that deviates at least slightly from a {111} surface crystal orientation, but improved performance of the semiconductor device 100 is nevertheless attained despite such deviation(s).

According to some embodiments, after the first channel portion 220 and second channel portion 230 are formed, the mask layer 150 is removed. In an embodiment, the mask layer is removed by etching. In some embodiments, a phosphorous material, such as a hot phosphorous material, is used to remove the mask layer 150.

Figure 4:
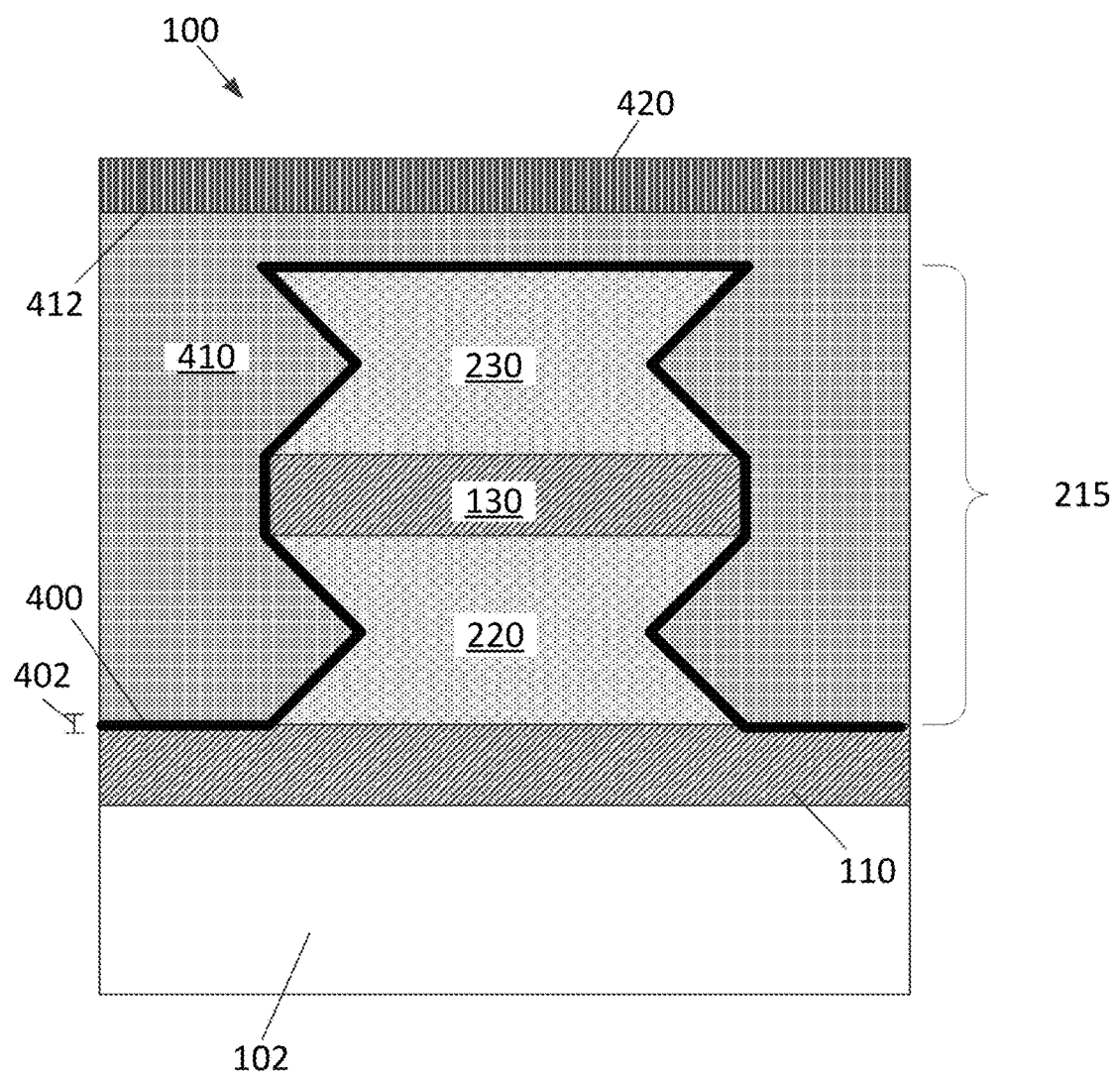
FIG. 4 illustrates a portion of a semiconductor device, according to an embodiment.

Turning to FIG. 4, in an embodiment, a dielectric layer 400 is formed over the channel 215. In some embodiments, the dielectric layer 400 is formed over the first channel portion 220, second channel portion 230, first layer 110 and second layer 130. The dielectric layer 400 is formed in any number of ways, such as by atomic layer deposition (ALD), or other suitable techniques, for example. The dielectric layer 400 comprises any number of materials, including, for example, oxides, silicon dioxide, etc., alone or in combination. In some embodiments, the dielectric layer 400 comprises a thickness 402 of about 20 angstroms to about 40 angstroms.

In an embodiment, a polysilicon layer 410 is formed over the dielectric layer 400. The polysilicon layer 410 is formed in any number of ways, such as by deposition, for example. According to some embodiments, the polysilicon layer 410 comprises silicon, polysilicon, etc. alone or in combination. In some embodiments, an upper surface 412 of the polysilicon layer 410 has a generally planar shape. According to some embodiments, following the formation of the polysilicon layer 410, the upper surface 412 is planarized, such as by a chemical mechanical polishing (CMP) process.

In an embodiment, a mask layer 420 is formed over the polysilicon layer 410. In some embodiments, the mask layer 420 is formed by deposition, for example. According to some embodiments, the mask layer 420 is formed over the upper surface 412 of the polysilicon layer 410. According to some embodiments, the mask layer 420 includes any number of materials, including oxides, silicon oxide, silicon nitride, etc., alone or in combination.

Figure 5A:
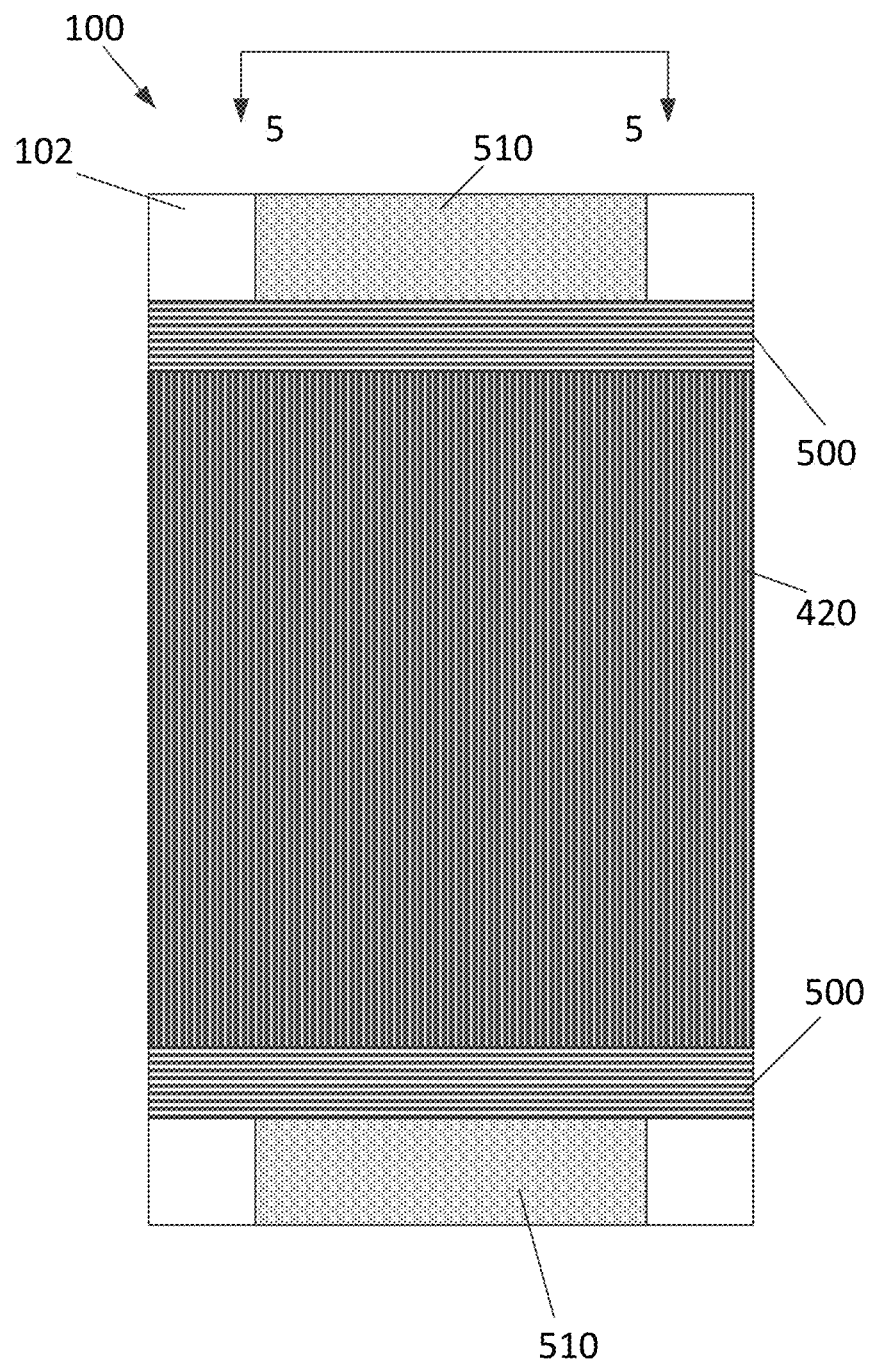
FIG. 5a illustrates a portion of a semiconductor device, according to an embodiment.
Figure 5B:
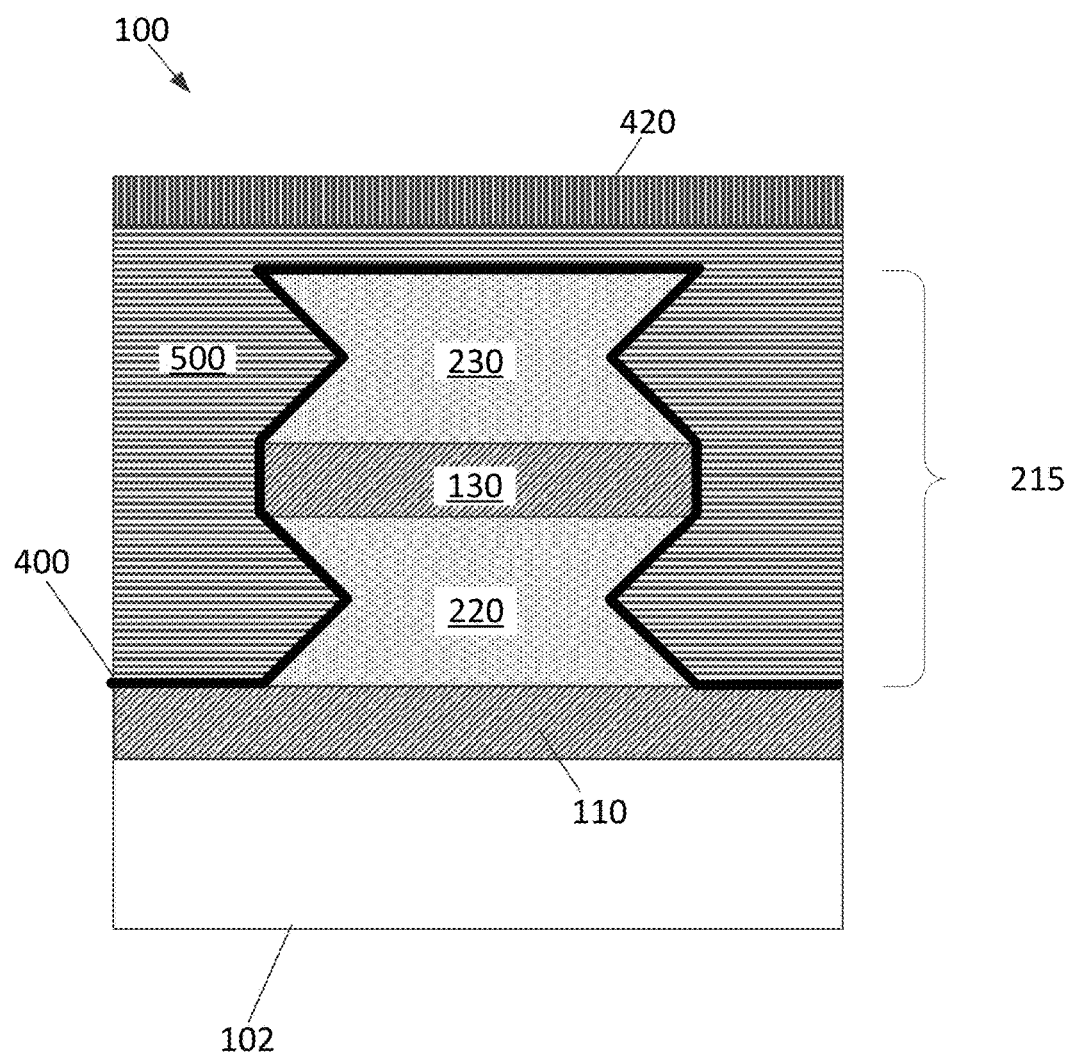
FIG. 5b illustrates a portion of a semiconductor device, according to an embodiment.
Figure 5C:
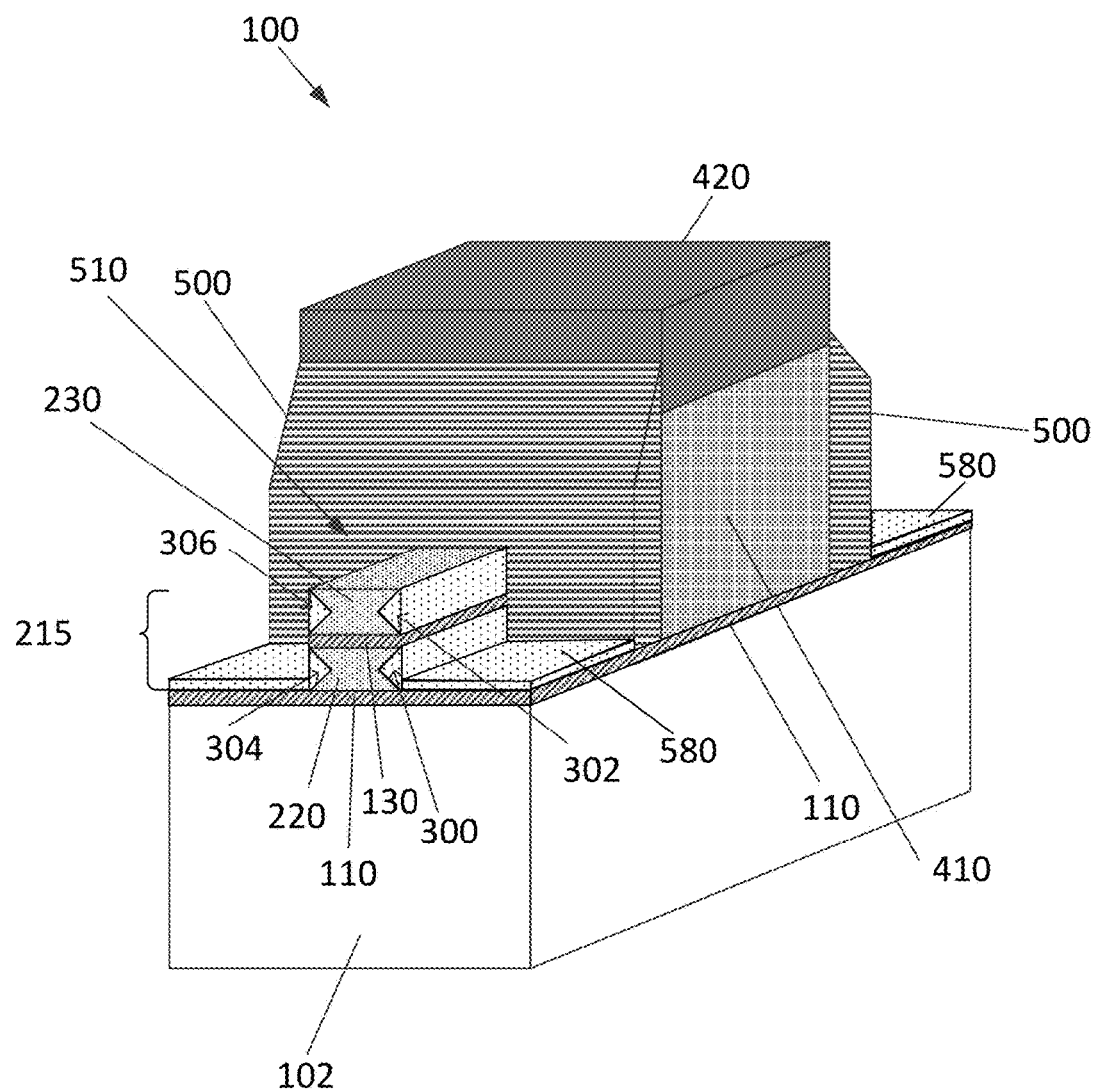
FIG. 5c illustrates a portion of a semiconductor device, according to an embodiment.

FIG. 5a is a plan view illustrating an example of the semiconductor device 100, FIG. 5b is a sectional view looking in to the embodiment of FIG. 5a from a perspective indicated by line 5-5, and FIG. 5c is a perspective view of the semiconductor device 100. In an embodiment, one or more spacers 500 are formed, such as by deposition and etching. According to some embodiments, the spacers 500 are formed at ends of the mask layer 420 after the mask layer 420 is patterned and the polysilicon layer 410 proximate channel portions 510 at ends of the semiconductor device 100 are removed (illustrated in FIG. 5c). In some embodiments, the spacers 500 cover some but not all of the first channel portion 220 and the second channel portion 230, such that the channel portions 510 at ends of the semiconductor device 100 are not covered by the spacers 500. According to some embodiments, the spacers 500 include any number of materials, including nitrides, polynitrides, etc., alone or in combination.

The mask layer 420 is patterned and the polysilicon layer 410 is removed from the channel portions 510 in any number of ways, such as by a timed etch, for example. In some embodiments, the polysilicon layer 410 is removed with chlorine, hydrogen bromide, etc., alone or in combination. In an embodiment, after the mask layer 420 is patterned and the polysilicon layer 410 is removed from channel portions 510 and the spacers 500 are formed, the channel portions 510 extend outwardly from the spacers 500.

According to some embodiments, given that FIG. 5b looks in to the end of the embodiment of FIG. 5a, the substrate 102, the first layer 110 under the first channel portion 220, the first channel portion 220, the second layer 130, and the second channel portion 230 extend out of the page more than spacer 500 and mask layer 420. According to some embodiments, spacer 500 extends out of the page more than the mask layer 420.

In some embodiments, the channel portions 510 include the polysilicon layer 410 within the first channel opening 300, second channel opening 302, third channel opening 304, and fourth channel opening 306 and the dielectric layer 400. As illustrated in FIG. 5c, according to some embodiments, the polysilicon layer 410 is removed from the first channel opening 300, second channel opening 302, third channel opening 304, and fourth channel opening 306 of the channel portions 510, such as by isotropic wet etching. In some embodiments, the wet etch chemistry includes tetramethylammonium hydroxide (TMAH), tetraethylammonium hydroxide (TEAH), ammonium hydroxide ($NH_4OH$), etc., alone or in combination. According to some embodiments, the wet etch chemistry selectively etches the polysilicon layer 410 while substantially not etching the first channel portion 220 or the second channel portion 230 due to the first channel portion 220 and second channel portion 230 being substantially covered by the dielectric layer 400. In some embodiments, after the polysilicon layer 410 is removed from the channel portions 510, a flowable oxide 580 is deposited to fill the first channel opening 300, second channel opening 302, third channel opening 304, and fourth channel opening 306 that were previously occupied by the polysilicon layer 410. In some embodiments, excess flowable oxide 580 is removed, such as with a selective dry etch. In an embodiment, this removal of the flowable oxide 580 exposes a top surface (e.g., first linear surface 310 illustrated in FIG. 3) of the second channel portion 230. In some embodiments, the top surface of the second channel portion 230 comprises an area on which a source and drain are grown.

Figure 6:
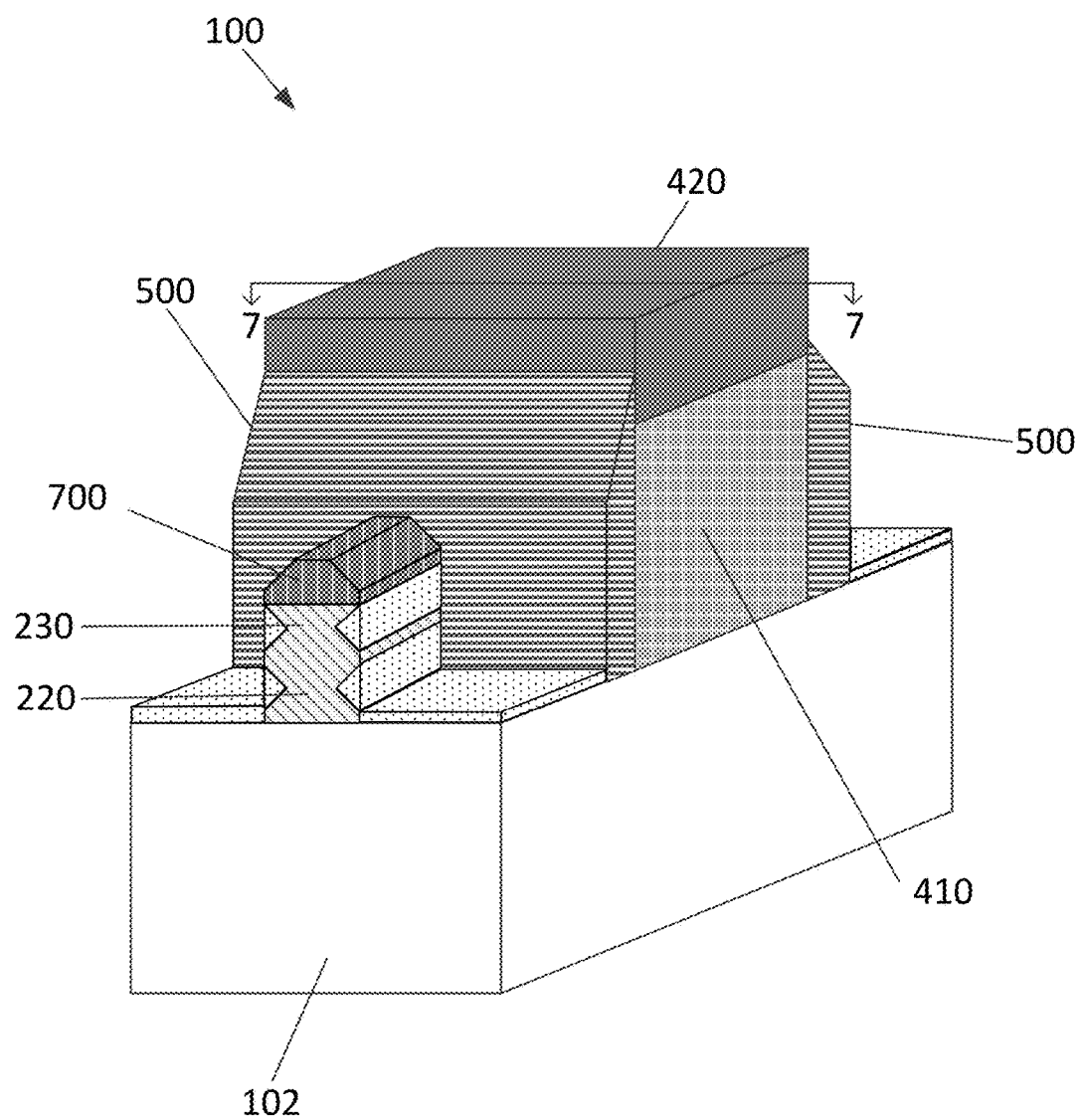
FIG. 6 illustrates a portion of a semiconductor device, according to an embodiment.

FIG. 6 is a plan view illustrating an example of the semiconductor device 100. In some embodiments, the second layer 130 (illustrated in FIG. 5c) is diffused into the first channel portion 220 and second channel portion 230. In some embodiments, the first layer 110 is diffused into the substrate 102 and the first channel portion 220, alone or in combination. In some embodiments, the first layer 110 and the second layer 130 are diffused as part of a heating process, in which the semiconductor device 100 is heated to a temperature sufficient to cause diffusion of the first layer 110 and the second layer 130. According to some embodiments, the first layer 110 and the second layer 130 are diffused during the formation of the semiconductor device 100, such as during periods of elevated temperatures. In some embodiments, after the first layer 110 and second layer 130 are diffused, the channel 215 comprises a mixture of materials, such as a mixture of silicon and germanium. In some embodiments, the dielectric layer 400 is removed, such as by etching for example. In an embodiment, the dielectric layer 400 is removed with tetrafluoromethane.

In an embodiment, a source region 700 and a drain region 702 (illustrated in FIG. 11) are formed. The source region 700 and drain region 702 are formed in any number of ways. According to some embodiments, the source region 700 and drain region 702 are epitaxially grown. In some embodiments, the source region 700 comprises an in situ doped silicon material. In some embodiments, the drain region 702 comprises an in situ doped silicon material. According to some embodiments, the source region 700 is grown on the second channel portion 230. According to some embodiments, the drain region 702 (illustrated in FIG. 11) is grown on the second channel portion 230.

Figure 7:
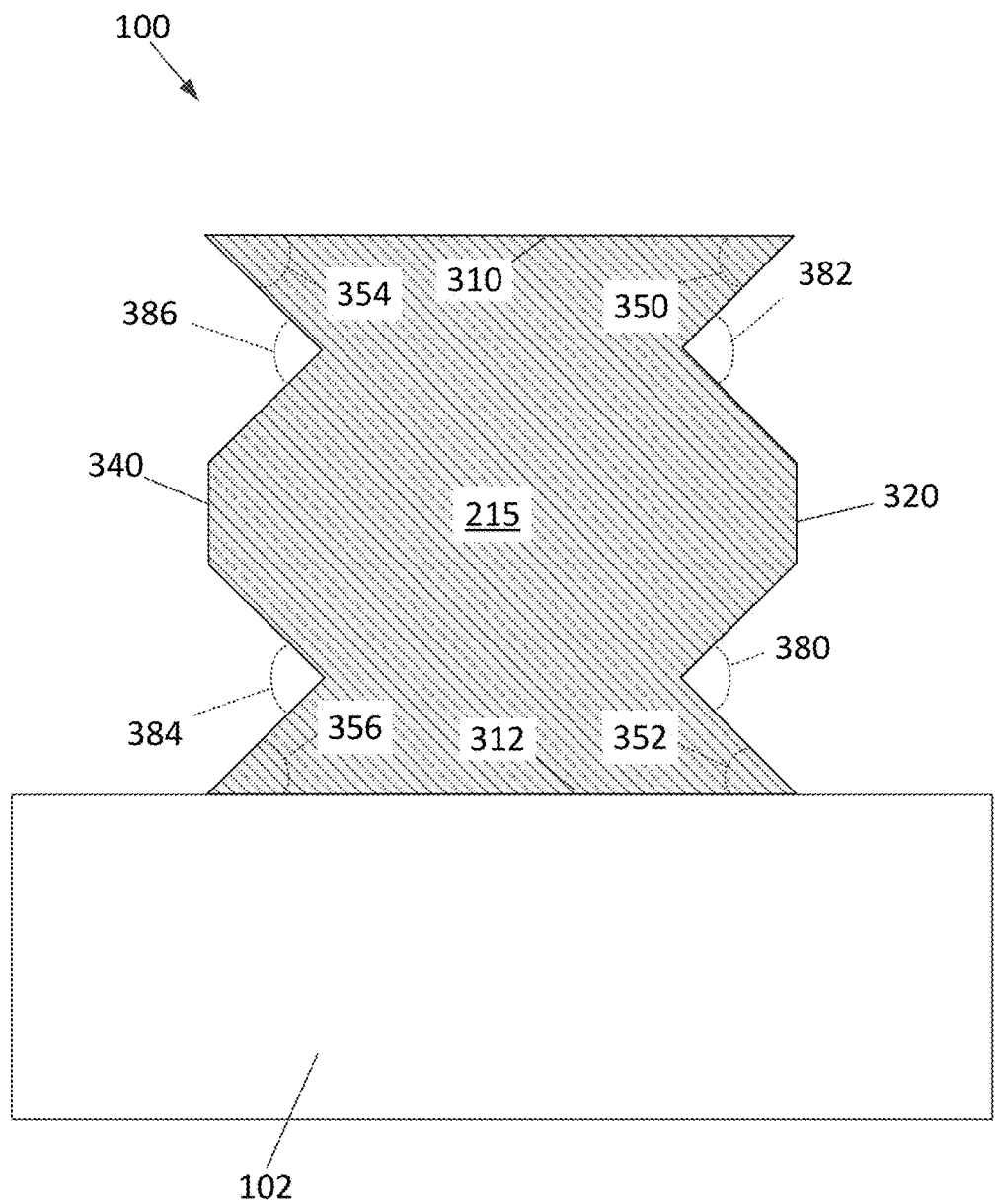
FIG. 7 illustrates a portion of a semiconductor device, according to an embodiment.

FIG. 7 is a sectional view illustrating the embodiment of FIG. 6 along line 7-7 after the dielectric layer, polysilicon layer 410, and mask layer 420 are removed from the semiconductor device 100 between the source region 700 and the drain region 702. The dielectric layer 400, polysilicon layer 410, and the mask layer 420 are removed in any number of ways, such as by wet etching, for example.

Figure 8:
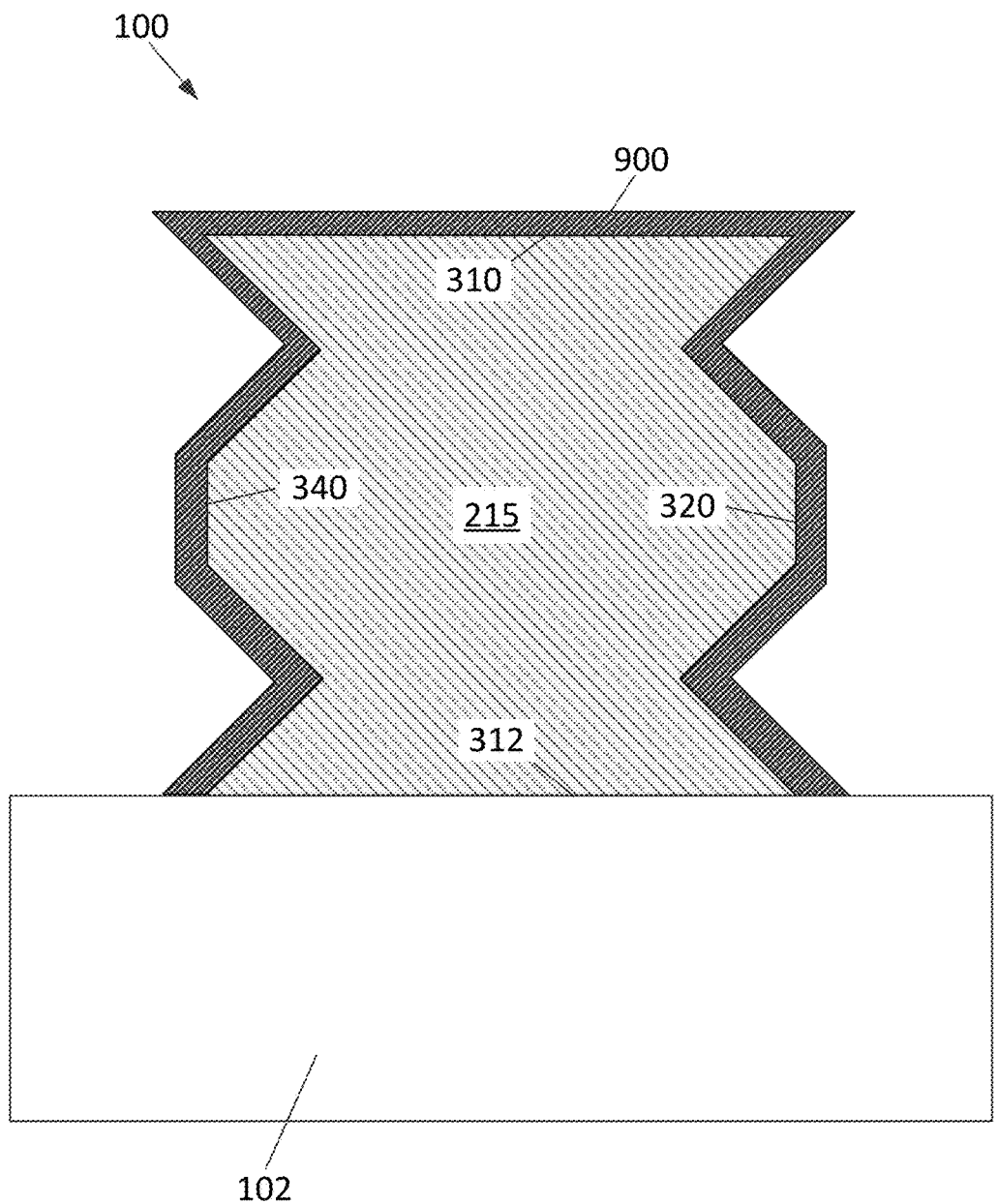
FIG. 8 illustrates forming a dielectric region associated with forming a semiconductor device, according to an embodiment.

Turning to FIG. 8, in some embodiments, a dielectric region 900 is formed to cover the channel 215. In some embodiments, the dielectric region 900 covers the first linear surface 310, the first non-linear surface 320, and the second non-linear surface 340. In some embodiments, the dielectric region 900 does not cover the second linear surface 312. In some embodiments, the dielectric region 900 covers the channel 215 into and out of the page to the source region 700 and the drain region 702. In an embodiment, the dielectric region 900 comprises a dielectric material with a relatively high dielectric constant. In some embodiments, the dielectric region 900 comprises a standard dielectric material with a medium dielectric constant, such as $SiO_2$. The dielectric region 900 is formed in any number of ways, such as by atomic layer deposition (ALD), chemical vapor deposition (CVD), physical vapor deposition (PVD), etc.

Figure 9:
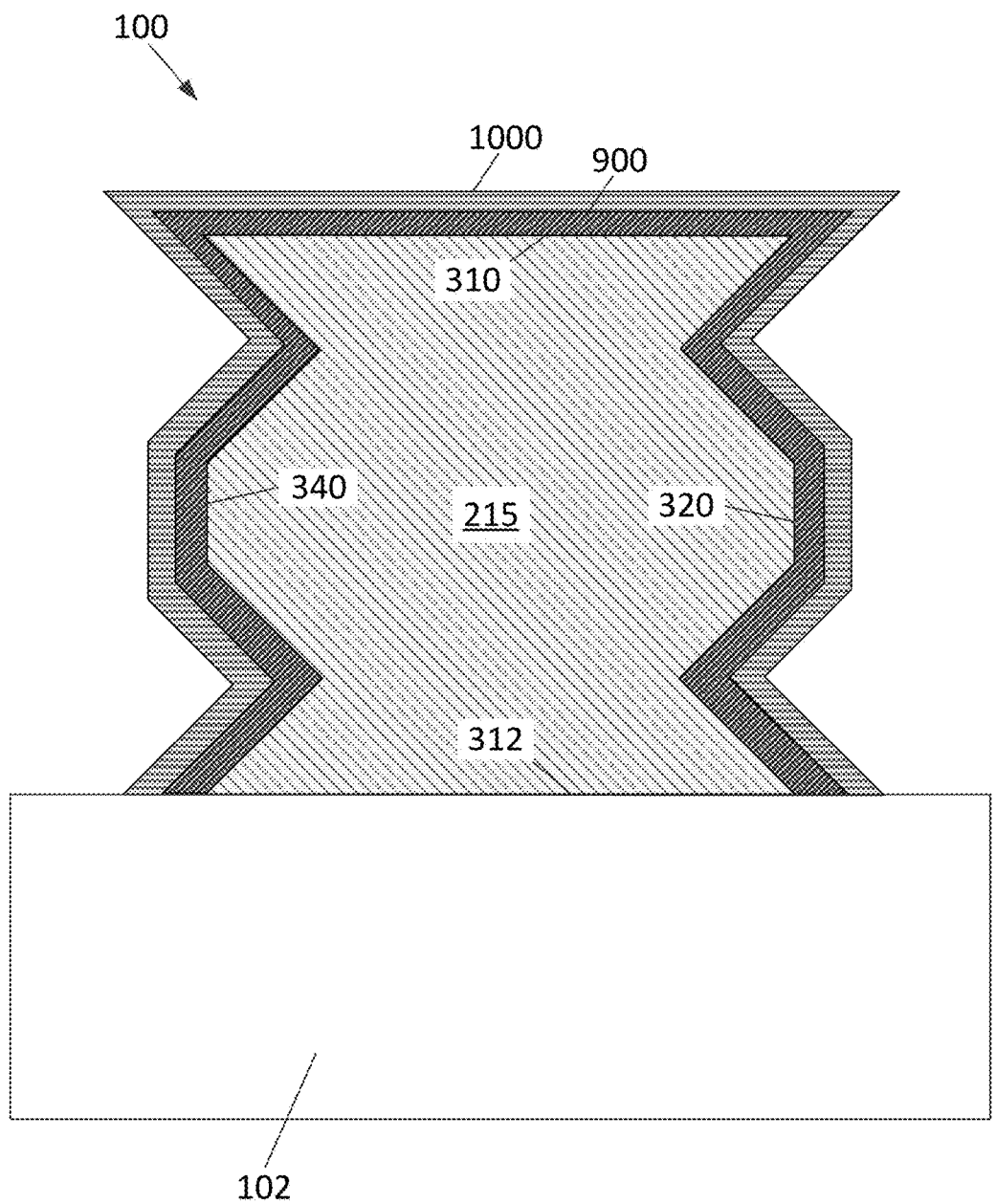
FIG. 9 illustrates forming a work function region associated with forming a semiconductor device, according to an embodiment.

Turning to FIG. 9, in some embodiments, a work function region 1000 is formed to cover the channel 215. In an embodiment, the work function region 1000 covers the dielectric region 900. In some embodiments, the work function region 1000 extends into and out of the page to the source region 700 and the drain region 702. In an embodiment, the work function region 1000 comprises a p-type work function metal. In an embodiment, the work function region 1000 comprises an n-type work function metal. In some embodiments, the work function region 1000 is formed by chemical vapor deposition (CVD), physical vapor deposition (PVD), etc., or other suitable processes.

Figure 10:
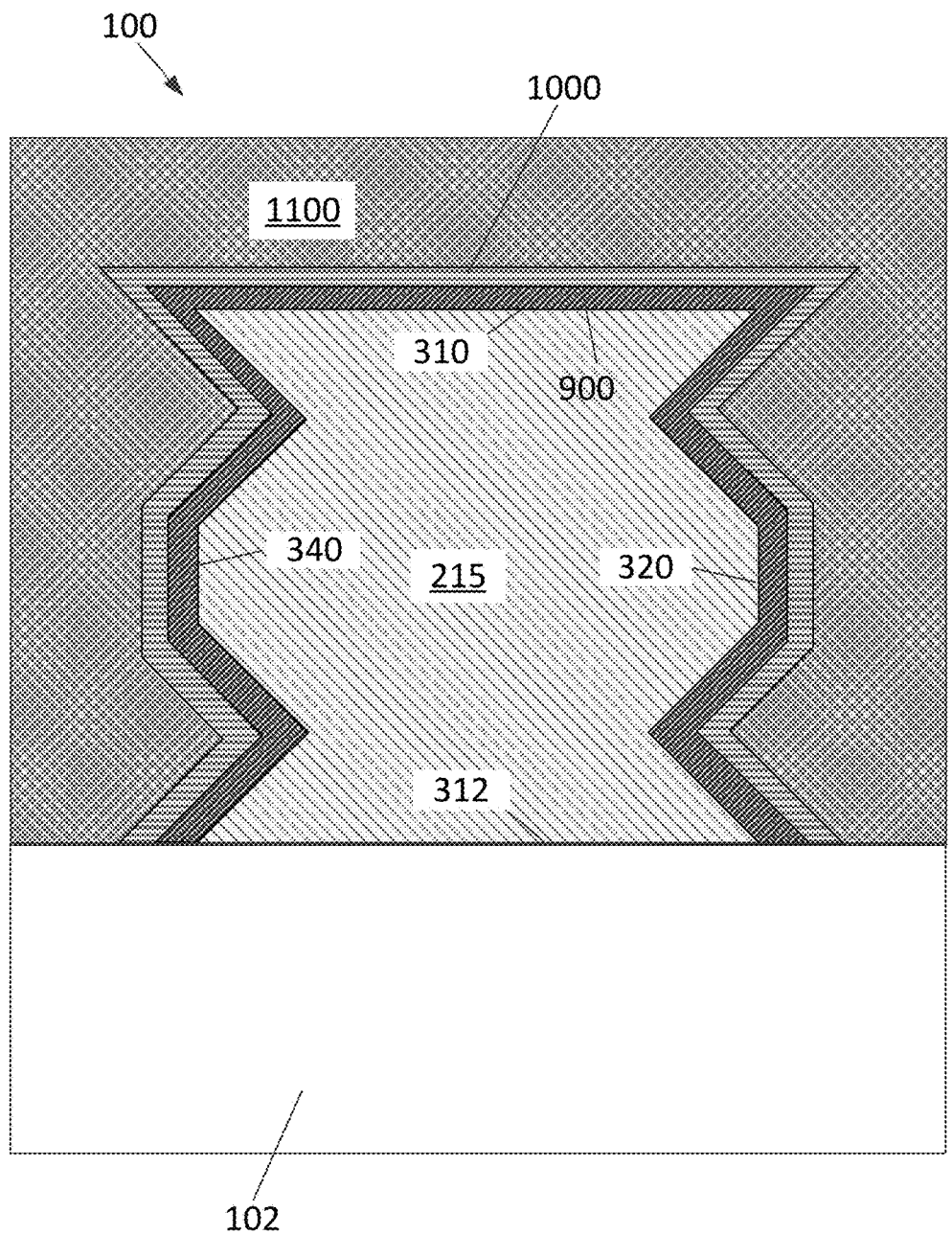
FIG. 10 illustrates forming a gate electrode associated with forming a semiconductor device, according to an embodiment.
Figure 11:
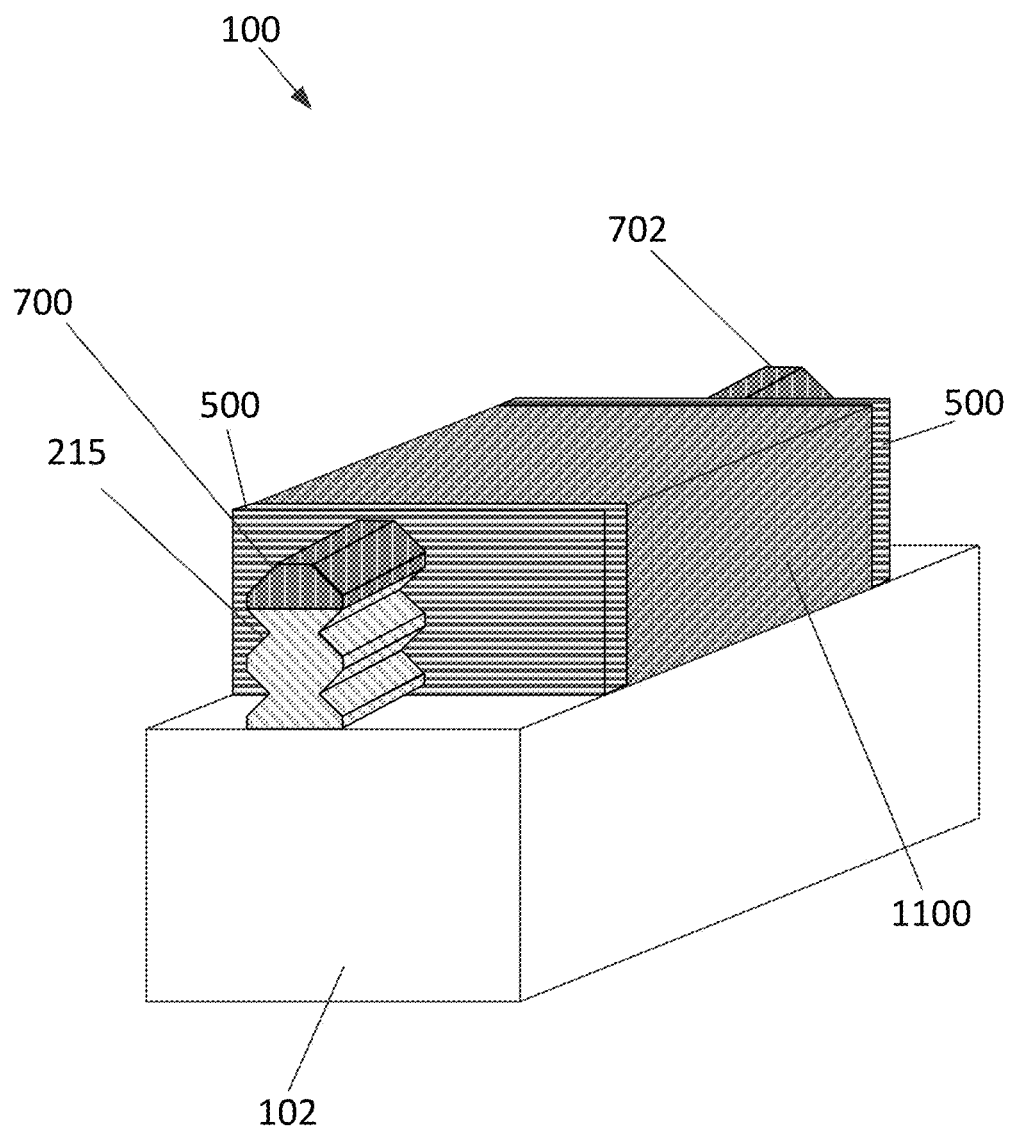
FIG. 11 illustrates a semiconductor device, according to an embodiment.

FIG. 10 illustrates the formation of a gate electrode 1100, and FIG. 11 is a perspective view illustrating the semiconductor device 100 comprising the gate electrode 1100. In some embodiments, the gate electrode 1100 covers the work function region 1000, such that the semiconductor device 100 comprises a fin-type field effect transistor structure with multiple surfaces having a {111} surface crystal orientation. According to some embodiments, the work function region 1000 is disposed between the dielectric region 900 and the gate electrode 1100. The gate electrode 1100 is formed in any number of ways, such as by deposition, epitaxial growth, etc., for example. In some embodiments, the gate electrode 1100 includes a conductive material, such as aluminum, tungsten, copper, etc., alone or in combination.

According to some embodiments, the channel 215 of the semiconductor device 100 comprises a {111} surface crystal orientation, such as at least one of the first non-linear surface 320 or the second non-linear surface 340. In some embodiments, mobility through the channel 215 is improved as a result of the channel 215 comprising the {111} surface crystal orientation. In an embodiment, the fin-type field effect transistor structure is capable of exerting or exercising more control over the channel 215 or, rather, more control over current flow through the channel 215 between the source region 700 and the drain region 702 at least because the gate electrode 1100 extends around more than one side of the channel 215.

Figure 12:
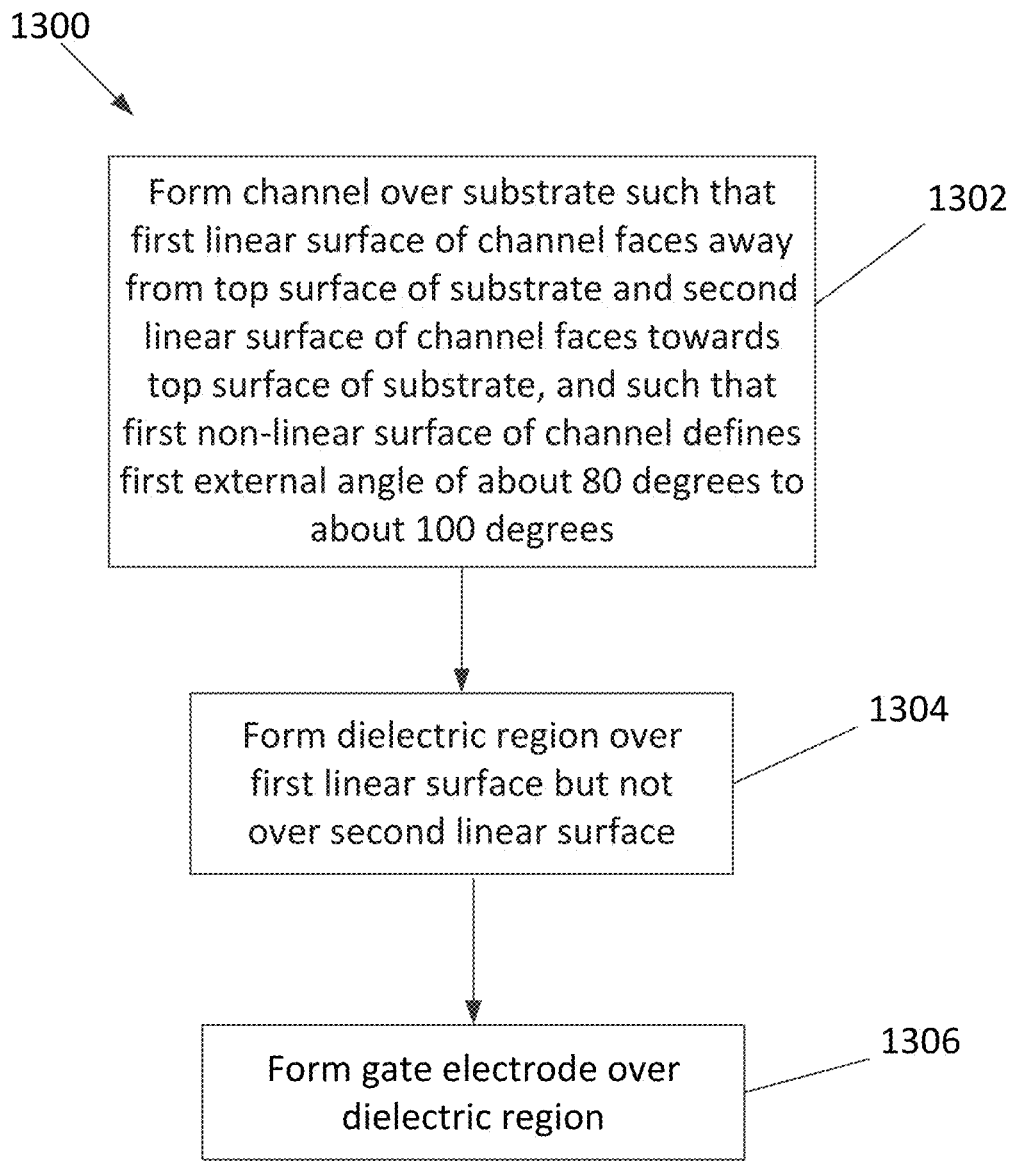
FIG. 12 illustrates a method of forming a semiconductor device, according to an embodiment.

An example method 1300 of forming a semiconductor device, such as semiconductor device 100, according to some embodiments, is illustrated in FIG. 12. At 1302, the channel 215 is formed over the substrate 102 such that the first linear surface 310 of the channel 215 faces away from the top surface 311 of the substrate 102 and the second linear surface 312 of the channel 215 faces towards the top surface 311 of the substrate 102, such that the first non-linear surface 320 of the channel 215 defines a first external angle 380 of about 80 degrees to about 100 degrees. At 1304, the dielectric region 900 is formed over the first linear surface 310 but not over the second linear surface 312. At 1306, the gate electrode 1100 is formed over the dielectric region 900.

In an embodiment, a semiconductor device comprises a channel having a first linear surface and a first non-linear surface. In an embodiment, the first non-linear surface defines a first external angle of about 80 degrees to about 100 degrees and a second external angle of about 80 degrees to about 100 degrees. In an embodiment, the semiconductor device comprises a dielectric region covering the channel. In an embodiment, the semiconductor device comprises a gate electrode covering the dielectric region.

In an embodiment, the semiconductor device comprises a channel having a first linear surface, a second linear surface, a first non-linear surface, and a second non-linear surface. In an embodiment, the first linear surface is substantially diametrically opposed to the second linear surface. In an embodiment, the first non-linear surface is substantially diametrically opposed to the second non-linear surface. In an embodiment, the semiconductor device comprises a dielectric region covering the first linear surface but not the second linear surface. In an embodiment, the semiconductor device comprises a gate electrode covering the dielectric region.

In an embodiment, a method of forming a semiconductor device comprises forming a channel over a substrate such that a first linear surface of the channel faces away from a top surface of the substrate and a second linear surface of the channel faces towards the top surface of the substrate, and such that a first non-linear surface of the channel defines a first external angle of about 80 degrees to about 100 degrees. In an embodiment, the method comprises forming a dielectric region over the first linear surface but not over the second linear surface. In an embodiment, the method comprises forming a gate electrode over the dielectric region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first angle and a second angle generally correspond to angle A and angle B or two different or two identical angles or the same angle.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
    forming an arrangement comprising:
        a first semiconductor substrate;
        an etch stop layer (ESL) overlying the first semiconductor substrate; and
        a second semiconductor substrate overlying the ESL;
    performing a first etch on the second semiconductor substrate, the ESL, and the first semiconductor substrate to define a first opening, the first opening exposing a first sidewall of the second semiconductor substrate, a first sidewall of the ESL, and a first sidewall of the first semiconductor substrate, wherein the ESL has a first width, measured from the first sidewall of the ESL to a second sidewall of the ESL, after the first etch;
    performing a second etch on the first sidewall of the second semiconductor substrate and the first sidewall of the first semiconductor substrate, the second etch modifying a profile of the first sidewall of the second semiconductor substrate to define a first recess and a profile of the first sidewall of the first semiconductor substrate to define a second recess, wherein the ESL has the first width after the second etch;
    forming a polysilicon layer in at least one of the first recess or the second recess adjacent to a first portion of the arrangement and in at least one of the first recess or the second recess adjacent to a second portion of the arrangement;
    removing the polysilicon layer in the at least one of the first recess or the second recess adjacent to the second portion of the arrangement; and
    forming an oxide in the at least one of the first recess or the second recess adjacent to a second portion of the arrangement after removing the polysilicon layer.

2. The method of claim 1, wherein the ESL comprises silicon germanium.

3. The method of claim 1, wherein forming the arrangement comprises epitaxially growing the second semiconductor substrate on the ESL.

4. The method of claim 1, comprising:
    forming a mask layer over the second semiconductor substrate; and
    patterning the mask layer to define a first mask opening and a second mask opening, wherein:
        the first etch defines the first opening in a portion of the arrangement underlying the first mask opening; and
        the first etch defines a second opening in a portion of the arrangement underlying the second mask opening.

5. The method of claim 4, the second opening exposing a second sidewall of the second semiconductor substrate, the second sidewall of the ESL, and a second sidewall of the first semiconductor substrate.

6. The method of claim 5, wherein:
    performing the second etch comprises performing the second etch on the second sidewall of the second semiconductor substrate and the second sidewall of the first semiconductor substrate, the second etch modifying a profile of the second sidewall of the second semiconductor substrate and a profile of the second sidewall of the first semiconductor substrate.

7. The method of claim 1, comprising:
    removing the polysilicon layer in the at least one of the first recess or the second recess adjacent to the first portion of the arrangement after forming the oxide; and
    forming a gate electrode in the first opening and over the first portion of the arrangement.

8. The method of claim 1, wherein:
    the first sidewall of the first semiconductor substrate is non-linear after performing the second etch, a first portion of the first sidewall of the first semiconductor substrate abutting a second portion of the first sidewall of the first semiconductor substrate at an angle of about 80 degrees to about 100 degrees; and
    the first sidewall of the second semiconductor substrate is non-linear after performing the second etch, a first portion of the first sidewall of the second semiconductor substrate abutting a second portion of the first sidewall of the second semiconductor substrate at an angle of about 80 degrees to about 100 degrees.

9. The method of claim 1, comprising forming a gate electrode in the first opening and over the first portion of the arrangement.

10. The method of claim 9, comprising forming a work function layer in the first opening and over the first portion of the arrangement prior to forming the gate electrode.

11. The method of claim 9, comprising performing an anneal process to diffuse the ESL into the first semiconductor substrate and the second semiconductor substrate prior to forming the gate electrode.

12. The method of claim 1, comprising performing an anneal process to diffuse the ESL into the first semiconductor substrate and the second semiconductor substrate.

13. The method of claim 1, wherein:
the first etch is a dry etch; and
the second etch is a wet etch.

14. A method, comprising:
forming an arrangement comprising:
a first semiconductor substrate;
an etch stop layer (ESL) overlying the first semiconductor substrate; and
a second semiconductor substrate overlying the ESL;
performing a set of etch processes to modify a perimeter profile of the first semiconductor substrate and a perimeter profile of the second semiconductor substrate, wherein after the set of etch processes:
a first sidewall of the first semiconductor substrate is non-linear, a first portion of the first sidewall of the first semiconductor substrate abutting a second portion of the first sidewall of the first semiconductor substrate at an angle of about 80 degrees to about 100 degrees; and
a first sidewall of the second semiconductor substrate is non-linear, a first portion of the first sidewall of the second semiconductor substrate abutting a second portion of the first sidewall of the second semiconductor substrate at an angle of about 80 degrees to about 100 degrees.

15. The method of claim 14, comprising depositing a dielectric after performing the set of etch processes, the dielectric in contact with the first sidewall of the first semiconductor substrate, a first sidewall of the ESL, and the first sidewall of the second semiconductor substrate.

16. The method of claim 15, comprising forming a gate electrode over the dielectric.

17. The method of claim 14, comprising performing an anneal process to diffuse the ESL into the first semiconductor substrate and the second semiconductor substrate.

18. The method of claim 14, wherein the set of etch processes comprising:
a first etch to define a first opening, the first opening exposing the first sidewall of the first semiconductor substrate, a first sidewall of the ESL, and the first sidewall of the second semiconductor substrate; and
a second etch to modify a profile of the first sidewall of the first semiconductor substrate and a profile of the first sidewall of the second semiconductor substrate.

19. A method, comprising:
forming an arrangement comprising:
a first semiconductor substrate;
an etch stop layer (ESL) overlying the first semiconductor substrate; and
a second semiconductor substrate overlying the ESL;
performing a first etch on the second semiconductor substrate, the ESL, and the first semiconductor substrate to define a first opening, the first opening exposing a first sidewall of the second semiconductor substrate, a first sidewall of the ESL, and a first sidewall of the first semiconductor substrate;
performing a second etch on the first sidewall of the second semiconductor substrate and the first sidewall of the first semiconductor substrate, the second etch modifying a profile of the first sidewall of the second semiconductor substrate to define a first recess and a profile of the first sidewall of the first semiconductor substrate to define a second recess;
forming a polysilicon layer in at least one of the first recess or the second recess adjacent to a first portion of the arrangement to fill the at least one of the first recess or the second recess adjacent to the first portion of the arrangement;
forming an oxide in at least one of the first recess or the second recess adjacent to a second portion of the arrangement after forming the polysilicon layer to fill the at least one of the first recess or the second recess adjacent to the second portion of the arrangement, wherein the second portion of the arrangement is different than the first portion of the arrangement; and
performing an anneal process to diffuse the ESL into the first semiconductor substrate and the second semiconductor substrate.

20. The method of claim 19, comprising:
forming the polysilicon layer in the at least one of the first recess or the second recess adjacent to the second portion of the arrangement; and
removing the polysilicon layer in the at least one of the first recess or the second recess adjacent to the second portion of the arrangement prior to forming the oxide.

* * * * *